United States Patent

Frederiksen

[15] 3,700,929

[45] Oct. 24, 1972

[54] INTEGRATED BISTABLE CIRCUIT

[72] Inventor: Thomas M. Frederiksen, Scottsdale, Ariz.

[73] Assignee: Motorola, Inc., Franklin Park, Ill.

[22] Filed: Jan. 10, 1972

[21] Appl. No.: 216,756

Related U.S. Application Data

[63] Continuation of Ser. No. 116,566, Feb. 18, 1971, abandoned.

[52] U.S. Cl. ....................307/291, 307/292, 307/303

[51] Int. Cl. ............................................H03k 3/286

[58] Field of Search..............307/291, 292, 303, 304

[56] References Cited

UNITED STATES PATENTS 3,272,997 9/1966 Kimura..................307/291 X 3,345,583 10/1967 Saunders...............307/291 X

*Primary Examiner*—John Zazworsky

*Attorney*—Mueller & Aichele

[57] ABSTRACT

A protected monolithic integrated flip-flop circuit comprises a pair of NPN transistors as the active flip-flop elements with the collectors of each of these transistors being supplied from a constant current source in the form of a dual-collector lateral PNP transistor. Collector-to-substrate distributed capacitance operates to retard the switching time of the flip-flop causing it to be a low speed flip-flop. A pair of substrate PNP transistors are used to apply the input trigger signals to the NPN transistors and operate to provide protection for the circuit against high positive or negative input voltages.

11 Claims, 1 Drawing Figure

PATENTED OCT 24 1972 3,700,929
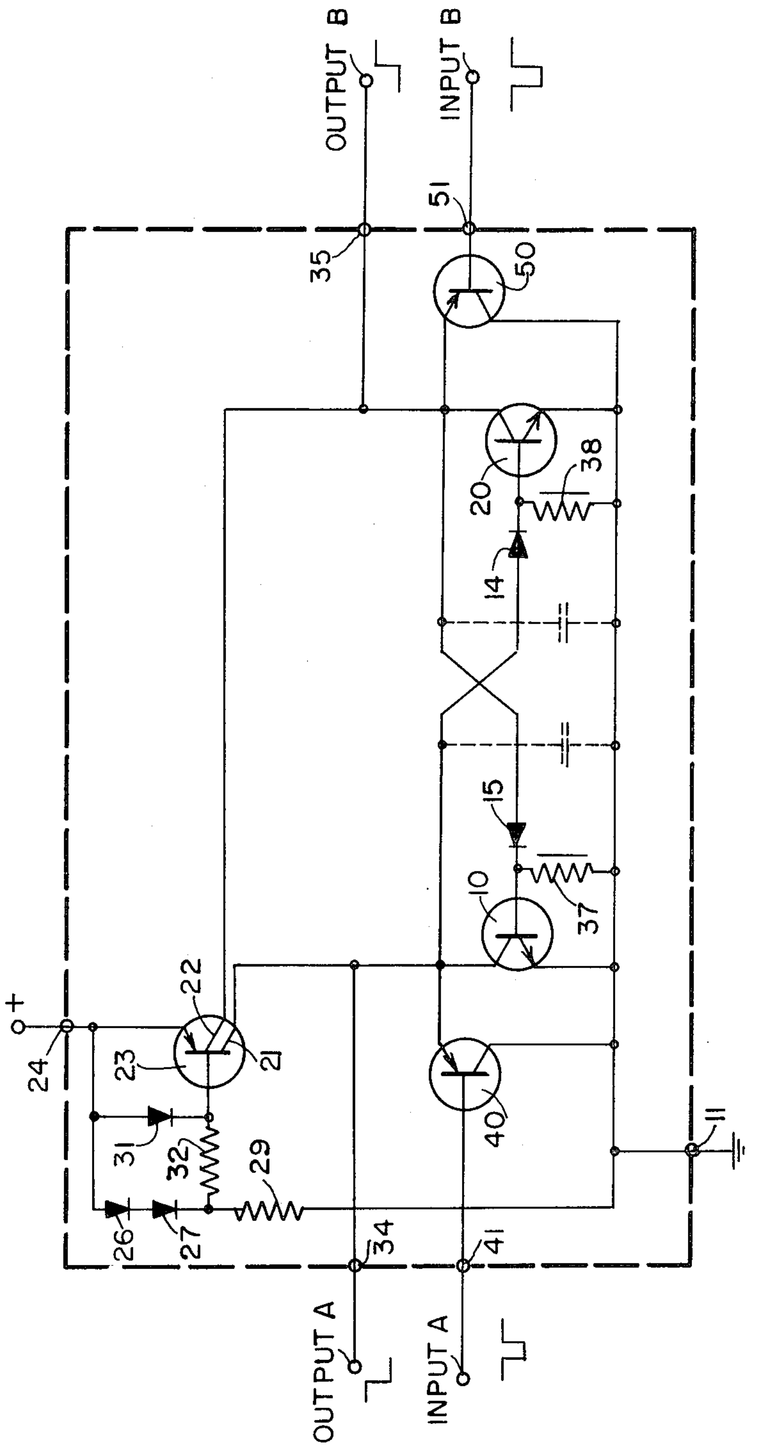
INVENTOR
THOMAS M. FREDERIKSEN
BY Mueller & Aichele
ATTYS.

INTEGRATED BISTABLE CIRCUIT

This is a continuation, of application Ser. No. 116,566 filed Feb. 18, 1971, and now abandoned.

BACKGROUND OF THE INVENTION

The advent of monolithic integrated circuit technology has made it possible to employ electronic circuits in many areas where previously the cost of electronic circuitry for control purposes and the like was prohibitive. One of the areas in which an increased interest in monolithic integrated circuits is presently being evidenced is in the automotive industry, with integrated circuits being utilized for tachometer driving circuits, vehicle operation monitoring circuits, fuel injection systems, voltage regulators, and the like. In order most advantageously to employ monolithic integrated circuits in the operating environment of a motor vehicle, it is necessary that the integrated circuits be capable of uniform operation over a wide range of ambient temperatures and over a wide range of operating voltages. In addition, for bistable or trigger circuits, it is necessary that the circuits are not subject to false triggering due to transient voltage spikes or the like, which may be present on the power supply or on the input terminals of the circuits.

It also is desirable to provide protection against overdriving of the transistors of integrated flip-flop or trigger circuits by either high positive or high negative voltage pulses which could damage the transistors if such pulses were allowed to be applied to them. Finally, as with most integrated circuits, it is desirable to build a circuit requiring a minimum die area.

SUMMARY OF THE INVENTION

Accordingly, it is an object of this invention to provide an improved bistable multivibrator circuit.

It is an additional object of this invention to provide an improved monolithic integrated bistable multivibrator circuit.

It is another object of this invention to provide an integrated bistable multivibrator circuit requiring a minimum die area.

It is yet another object of this invention to provide a monolithic integrated bistable circuit utilizing distributed capacitance for establishing the switching time of the bistable circuit.

It is a further object of this invention to provide a relatively slow-speed bistable multivibrator circuit.

It is still another object of this invention to provide protection for the switching transistors of an integrated bistable multivibrator circuit against excessive input signals of either positive or negative polarity.

In accordance with a preferred embodiment of this invention, a monolithic integrated bistable multivibrator circuit includes first and second switching transistors of the same conductivity type, with the collector of each transistor being cross-coupled to the transistor of the other transistor. The emitters of the transistors are connected to a point of reference potential and the collectors are each supplied with constant current from a constant current source. Pinch resistors are connected between the bases of each of the transistors and the point of reference potential, which comprises the substrate of the integrated circuit chip; and the distributed capacitance present between the collectors of the transistors and the substrate operates to delay the switching of the multivibrator to cause it to be a relatively slow-speed bistable or flip-flop circuit.

In a more specific embodiment of the invention, a pair of substrate PNP protection transistors are connected to receive the input triggering signals and to apply these signals from the emitters thereof to the output terminals of the bistable multi-vibrator. The high reverse breakdown characteristic of the base-emitter junctions of the substrate PNP transistors provides protection against the application of high positive input signals to the transistors of the bistable circuit. Protection against the application of large negative input signals to the circuit is afforded by the forward-biased base-collector junctions of the PNP transistors, which operate to clamp the bases of the PNP transistors to a potential established by the potential drop across the forward-biased collector-base junctions.

BRIEF DESCRIPTION OF THE DRAWING

The sole FIGURE of the drawing is a schematic diagram of a preferred embodiment of the invention.

DETAILED DESCRIPTION

Referring now to the drawing, there is shown a monolithic integrated bistable multivibrator of flip-flop circuit which is suitable for use with relatively high DC voltage sources (of the order of 28 volts or more) such as found in automobiles, airplanes, and the like. In the operating environments of such vehicles, the circuit also is subjected to a wide range of ambient operating temperatures and in addition may be subjected to substantial noise transients. The circuit shown in the drawing is designed to operate uniformly over a relatively wide range of DC supply potentials as well as over a wide range of ambient temperatures. In addition, the multivibrator of flip-flop circuit utilizes the distributed capacitances present between the collectors of the flip-flop transistors and the substrate on which the circuit is formed to cause a delay or slow-speed operation of the flip-flop. This delay is desirable in vehicular operating environments where high speed flip-flop operation is not necessary and helps to cause the flip-flop circuit to be relatively immune to noise transients which otherwise could cause false triggering of a high-speed multivibrator or flip-flop circuit.

In the drawing, the circuit components which are enclosed within the dotted line are formed as part of a monolithic integrated circuit, which may be an independent circuit independently packaged or which may be part of a larger integrated circuit including a number of other circuit components performing other circuit functions, if desired.

The basic portion of the bistable multivibrator of flip-flop circuit consists of a pair of NPN transistors 10 and 20, the emitters of which are connected to a grounded bonding pad 11 coupled to the substrate of the chip on which the circuit is formed. The collector of the transistor 10 is connected through a coupling diode 14 to the base of the transistor 20 and the collector of the transistor 20 is similarly connected through a diode 15 to the base of the transistor 10.

To cause the operation of the flip-flop circuit to be relatively immune from temperature variations and from variations in the B+ supply, the collectors of the transistors 10 and 20 are connected to different collectors 21 and 22, respectively, of a dual-collector lateral PNP transistor 23, the emitter of which is connected to a bonding pad 24 coupled to a source of suitable positive DC operating potential (not shown). The transistor 23 operates as an active constant current source and the current which is supplied by the transistor 23 through each of the collectors 21 and 22 is established by a voltage divider including a pair of diodes 26 and 27 connected in series with a resistor 29 between the bonding pads 24 and 11.

The potential drop across the diodes 26 and 27 remains relatively constant with variations in the potential applied to the bonding pad 24, and this potential drop further is divided by a divider consisting of a diode 31 and a resistor 32 connected in series across the diodes 26 and 27. The junction of the diode 31 and the resistor 32 is connected to the base of the transistor 23, with the diode 31 providing temperature compensation for the emitter-base junction of the transistor 23. Thus, the potential on the base of the transistor 23 is voltage regulated and temperature compensated to cause a constant current to be supplied from each of the collectors 21 and 22. The current source transistor 23 therefore exhibits a constant dynamic resistance characteristic to provide independence from supply voltage and ambient temperature variations.

By utilizing the current source transistor 23, the normal collector load resistors which otherwise would be connected to the collectors of the transistors 10 and 20 are eliminated, thereby reducing the die area required by this portion of the circuit when it is fabricated in monolithic integrated circuit form. The collectors of the transistors 10 and 20 are coupled to a pair of output bonding pads 34 and 35, respectively, to provide normal and inverted outputs from the flip-flop circuit.

The switching time for the flip-flop circuit including the transistors 10 and 20 is determined by RC circuits, the capacitances of which are formed by the stray or distributed capacitances between the collectors of the transistors 10 and 20 and the grounded substrate. A pair of pinch resistors 37 and 38 are connected between the bases of the transistors 10 and 20, respectively, and the grounded substrate and comprise the resistors of the RC delay circuits. By utilizing the stray capacitances, indicated in dotted lines in the drawing, which are present between the collectors of the transistors 10 and 20 and the substrate, the necessity for building capacitors into the circuit or for providing external bonding pads for connecting external capacitors to the circuit is eliminated.

Since in many applications the output voltage swing can be quite small, there also is no necessity for large area cross-coupling resistors interconnecting the collectors and bases of the transistors 10 and 20. The only resistors in the flip-flop circuit are the pinch resistors 37 and 38 which eliminate the need for devoting a large portion of the chip to resistors.

The output voltage swing of the signals at the output bonding pads 34 and 35 is determined by the number of diode junctions in each of the cross-coupling circuits. With a single diode junction, such as provided by the diodes 14 or 15, connected in the cross-coupling circuits, the output voltage swing is over a range of two $\phi$ (where $\phi$ equals the voltage drop across one diode junction, with one $\phi$ of this swing being provided by the diodes 14 or 15 and the other $\phi$ of this swing being provided by the base-emitter junction of the corresponding transistor 10 or 20). This swing is between $V_{SAT}$ (the potential on the collector of the transistor 10 or 20 when it is conducting at saturation) and two $\phi$, which is the potential on the collector of the transistor 10 or 20 when it is nonconductive, due to the voltage drop between the collector of such a nonconductive transistor and the grounded bonding pad 11 through the corresponding cross-coupling diode and base-emitter junction of the other or conductive transistor. If it is desired to have a greater output voltage swing, more diodes may be connected in series in the cross-coupling circuits, with each diode providing an additional one $\phi$ to the output voltage swing. Once one or the other of the transistors 10 or 20 is placed in a conductive state, the conduction thereof causes the other of the transistors to be held in a nonconductive state; and the circuit remains in this stable state of operation until it is triggered to the opposite state.

In order to change the state of operation of the flip-flop circuit including the transistors 10 and 20, input triggering pulses must be applied to the bases of the conductive transistor to render it nonconductive for a time interval sufficiently long to permit switching of the conductive states of the transistors. This time interval is determined by the distributed capacitances and the pinch resistors 37 and 38, as mentioned previously.

Negative input trigger pulses or signals could be applied directly to the cross-coupling junctions at the collectors of each of the transistors 10 and 20, and the circuit would assume a stable state of operation in accordance with whichever of the junctions was provided with such a negative pulse. It is desirable, however, to provide protection for the transistors 10 and 20 in the flip-flop circuit against high positive input potentials and also against excessive negative input potentials in order to prevent damage to the transistors 10 and 20. In the circuit shown in the drawing, this is accomplished by a pair of substrate PNP transistors 40 and 50, the collectors of which are connected to the substrate or grounded bonding pad 11, and the emitters of which are connected, respectively, to the collectors of the transistors 10 and 20. The base of the PNP substrate transistor 40 is connected to an input bonding pad 41, and the base of the substrate PNP transistor 50 is connected to an input bonding pad 51.

Assume for the purposes of illustration that the flip-flop circuit is in a stable state of operation with the transistor 20 conductive at saturation and the transistor 10 nonconductive. When this occurs, the output potential on the bonding pad 35 is low, corresponding to $V_{SAT}$, with most of the current supplied from the collector 22 of the current source transistor 23 being drawn through the transistor 20. On the other hand, the transistor 10 is nonconductive, being reverse biased by the low potential on the collector of the transistor 20. Thus, the current supplied by the collector 21 of the current source transistor 23 flows through the diode 14 and the base-emitter junction of the transistor 20 and the pinch resistor 38 to the grounded substrate bonding pad 11. This current is the forward-biasing or drive current for the transistor 20.

If a negative pulse then is applied to the bonding pad 41, the normally nonconductive PNP substrate transistor 40 is rendered conductive, thereby diverting the current flowing out of the collector 21 of the current source transistor 23 to a point where insufficient drive current is applied to the base of the transistor 20. The transistor 20 then is rendered nonconductive. When this occurs, the potential on its collector rises; and within a time interval determined by the time constants of the cross-coupling circuit including the distributed capacitance shown in dotted lines, the transistor 10 is rendered conductive. The current from the collector 21 of the current source transistor then is pulled through the collector-emitter path of the transistor 10, so that the transistor 20 continues to be cut off even though the transistor 40 may once again be rendered nonconductive. In this state of operation, the current supplied by the collector 22 of the current source transistor 23 operates as the forward-biasing or drive current for the transistor 10; and the signal present on the output bonding pad 34 drops to $V_{SAT}$ and the signal present on the output bonding pad 35 rises to two $\phi$, due to the potential drop across the diode 15 and the base-emitter junction of the transistor 10.

Subsequently, if a negative input pulse is applied to the terminal 51 of a magnitude sufficient to forward bias the substrate transistor 50 into conduction, the reverse state of operation occurs, with the transistor 10 being rendered nonconductive and the transistor 20 being rendered conductive.

The substrate PNP transistors 40 and 50 provide protection against excessive negative-going potentials being applied to the flip-flop circuit due to the fact that when the negative-going input pulses drop below ground by an amount in excess of 1 $\phi$ (approximately .7 volts), the collector-base junction of the substrate PNP transistor 40 or 50 becomes forward-biased. This clamps the base thereof to one $\phi$ below ground potential. On the other hand, if a high positive voltage or transient pulse is applied to the base of either the transistors 40 or 50, the high reverse voltage rating of the emitter-base junction of the substrate PNP transistor blocks the application of such pulses and prevents their reaching the inputs of the flip-flop circuit. This reverse voltage protection provides protection for such reverse positive voltages of a magnitude up to approximately 100 volts.

A flip-flop circuit constructed in accordance with the foregoing requires very little die area since the only resistors which are employed in the flip-flop circuit itself are pinch resistors. In addition, the circuit is particularly well suited for operation in motor vehicles or airplanes and the like due to the fact that it is a relatively low speed circuit which renders it desirable for use in such applications where noise transients occur frequently. Since the circuit operates from a constant current source it is relatively immune to variations in B+ supply and ambient temperature. The substrate PNP transistors provided at the inputs of the flip-flop function to provide adequate protection against excessive positive or negative input voltages.

I claim:

1. A monolithic integrated bistable multivibrator circuit including in combination:

first and second DC supply terminals;

first and second transistors of the same conductivity type and each having first, second and control electrodes;

means coupling the second electrodes of said first and second transistors with said second supply terminal;

means coupling the first electrode of said first transistor with the control electrode of said second transistor;

means coupling the first electrode of said second transistor with the control electrode of said first transistor;

first and second constant current sources coupled between said first supply terminal and the first electrodes of said first and second transistors, respectively;

third and fourth transistors of opposite conductivity type to the conductivity type of said first and second transistors, said third and fourth transistors each having first, second and control electrodes, with the first electrodes thereof coupled with said second supply terminal;

means coupling the second electrode of said third transistor with the first electrode of said first transistor;

means coupling the second electrode of said fourth transistor with the first electrode of said second transistor; and means for applying trigger signals to the control electrode of at least one of said third and fourth transistors.

2. The combination according to claim 1 further including means for applying a positive operating potential to said first supply terminal and means for connecting said second supply terminal to a point of reference potential, wherein said first and second transistors are NPN transistors, having collector, emitter, and base electrodes corresponding to the first, second and control electrodes, respectively, and said third and fourth transistors are substrate PNP transistors, having collector, emitter, and base electrodes corresponding to the first, second and control electrodes, respectively.

3. The combination according to claim 2 wherein said first and second current sources are provided by a dual-collector lateral PNP transistor, having base, emitter and first and second collector electrodes, with the emitter thereof connected to said first supply terminal and the first and second collectors thereof connected with the collectors of said first and second transistors, respectively, and further including means for supplying a temperature and voltage stabilized DC operating potential to the base of said dual-collector lateral PNP transistor.

4. The combination according to claim 3 further including first and second pinch resistors connected between said second supply terminal and the bases of said first and second transistors, respectively.

5. A monolithic integrated bistable multivibrator circuit including in combination:

first and second DC supply terminals;

first and second transistors of the same conductivity type, each having first, second and control electrodes;

means coupling the second electrodes of said first and second transistors with said second supply terminal;

means coupling the first electrode of each of said transistors with the control electrode of the other of said transistors;

first and second current sources coupled between said first supply terminal and the first electrodes of said first and second transistors, respectively; and first and second pinch resistors coupled between said second supply terminal and the control electrodes of said first and second transistors, respectively.

6. The combination according to claim 5 wherein said means coupling the first electrode of each of said transistors with the control electrode of the other comprises first diode means coupling the first electrode of said first transistor with the control electrode of said second transistor and second diode means coupling the first electrode of said second transistor with the control electrode of said first transistor.

7. The combination according to claim 5 further including third and fourth transistors of a conductivity type opposite to the conductivity type of said first and second transistors, said third and fourth transistor each having first, second and control electrodes, with the second electrodes of the third and fourth transistors being coupled to the first electrodes of said first and second transistors, respectively, the first electrodes of said third and fourth transistors being connected with the second supply terminal; and means for applying input signals to the control electrodes of said third and fourth transistors to change the conductivity state of the multivibrator circuit.

8. The combination according to claim 5 wherein said first and second current sources are active constant current sources, the combination further including a voltage divider comprising diode means and resistance means connected together at a junction and connected in series between said first and second supply terminals to form a voltage divider, with the junction being coupled to said first and second constant current sources for providing a biasing potential to establish the current supplied thereby.

9. The combination according to claim 8 wherein said first and second constant current sources comprise transistor means having at least control, second and a pair of first electrodes, the control electrode being coupled to the junction on said voltage divider means, said second electrode being connected with said first supply terminal and said first electrodes being connected with the first electrodes of said first and second transistors, said current source transistor means being of a conductivity type opposite to the conductivity type of said first and second transistors.

10. The combination according to claim 9 wherein said first and second transistors have collector, emitter and base electrodes corresponding respectively to the first, second, and control electrodes and said current source transistor means includes a dual-collector transistor having base, emitter, and first and second collectors, with the base corresponding to the control electrode the emitter corresponding to the second electrode and the first and second collectors corresponding to the pair of first electrodes connected to the collectors of said first and second transistors, respectively.

11. The combination according to claim 10 wherein said dual-collector current source transistor is a lateral PNP transistor said first and second transistors are NPN transistors, and further including first diode means connected to conduct current from the collector of said first transistor and the base of said second transistor and second diode means connected to conduct current from the collector of said second transistor to the base of said first transistor.

* * * * *